(12) United States Patent
Matsuo et al.

(10) Patent No.: US 7,757,138 B2
(45) Date of Patent: Jul. 13, 2010

(54) SEMICONDUCTOR INTEGRATED CIRCUIT, TEST DATA GENERATING DEVICE, LSI TEST DEVICE, AND COMPUTER PRODUCT

(75) Inventors: Tatsuru Matsuo, Kawasaki (JP); Takahisa Hiraide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 560 days.

(21) Appl. No.: 11/797,347

(22) Filed: May 2, 2007

(65) Prior Publication Data
US 2007/0288821 A1    Dec. 13, 2007

(30) Foreign Application Priority Data

May 2, 2006  (JP)  .............................. 2006-128141
Mar. 13, 2007 (JP)  .............................. 2007-064035

(51) Int. Cl.
*G01R 31/28* (2006.01)
(52) U.S. Cl. .................. 714/726; 714/724; 714/732
(58) Field of Classification Search .......... 714/725–729
See application file for complete search history.

(56) References Cited

U.S. PATENT DOCUMENTS

| | | | |
|---|---|---|---|
| 6,557,129 B1 * | 4/2003 | Rajski et al. ................ | 714/729 |
| 6,745,359 B2 * | 6/2004 | Nadeau-Dostie ............ | 714/726 |
| 6,901,546 B2 * | 5/2005 | Chu et al. ................... | 714/738 |
| 7,032,148 B2 * | 4/2006 | Wang et al. ................. | 714/729 |
| 7,058,869 B2 * | 6/2006 | Abdel-Hafez et al. ....... | 714/729 |
| 7,096,397 B2 * | 8/2006 | Kundu et al. ................ | 714/732 |
| 7,404,126 B2 * | 7/2008 | Jain et al. ................... | 714/726 |
| 2002/0093356 A1 * | 7/2002 | Williams et al. ............ | 324/765 |
| 2002/0124217 A1 * | 9/2002 | Hiraide et al. .............. | 714/726 |
| 2005/0240848 A1 * | 10/2005 | Cote et al. .................. | 714/726 |

FOREIGN PATENT DOCUMENTS

JP    2002-236144    8/2002

\* cited by examiner

*Primary Examiner*—Kevin L Ellis
*Assistant Examiner*—Steve Nguyen
(74) *Attorney, Agent, or Firm*—Staas & Halsey LLP

(57) ABSTRACT

A semiconductor integrated circuit includes plural shift registers that receive plural test patterns randomly generated, respectively, a mask device that masks, among the shift registers, a target shift register specified by a mask pattern randomly generated. When a shift register other than the target shift register outputs an unknown value, the mask device masks the shift register according to a control signal. When the target shift register outputs a fault value, the mask device releases a mask of the target shift register according to a control signal.

8 Claims, 15 Drawing Sheets

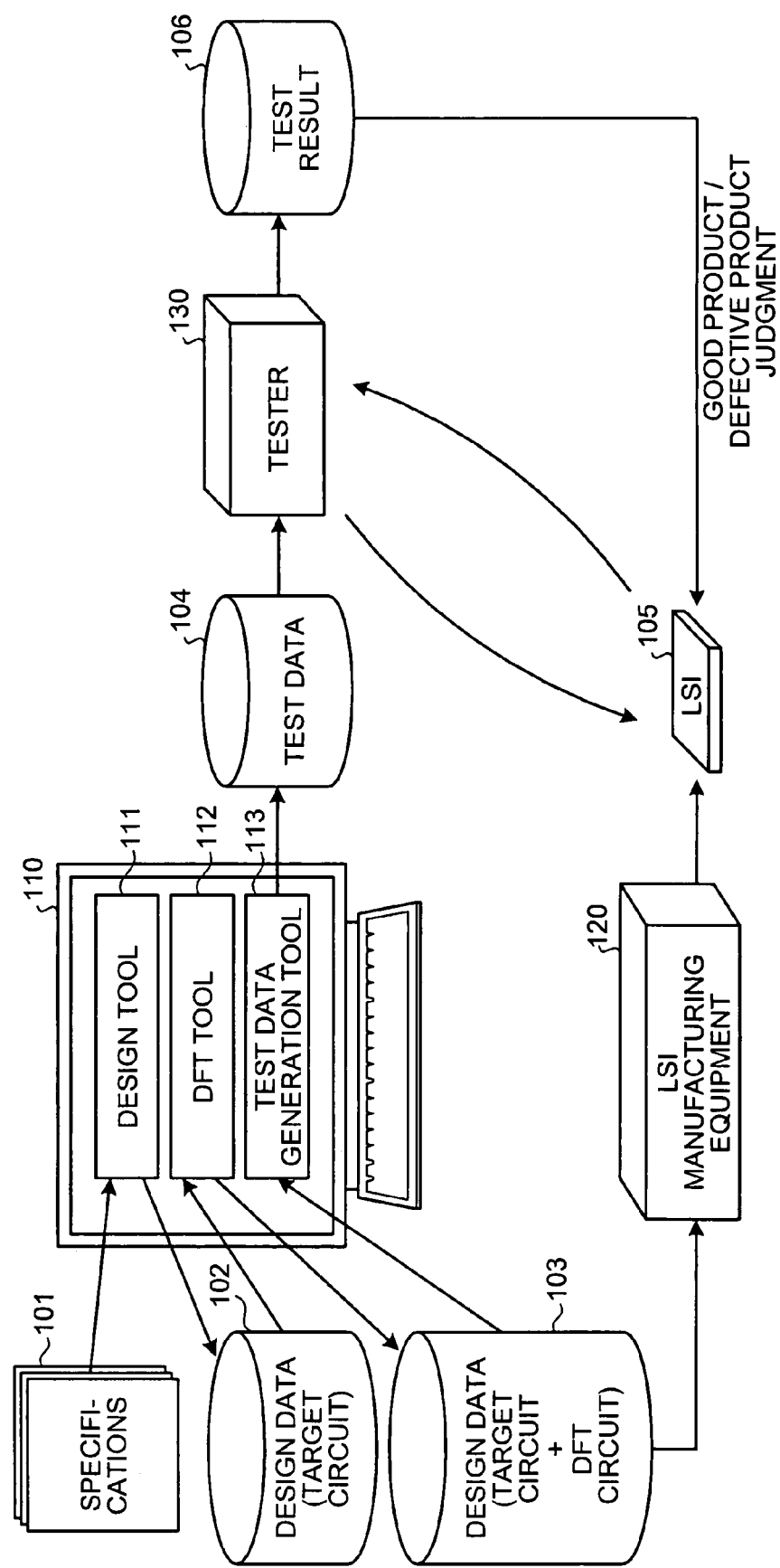

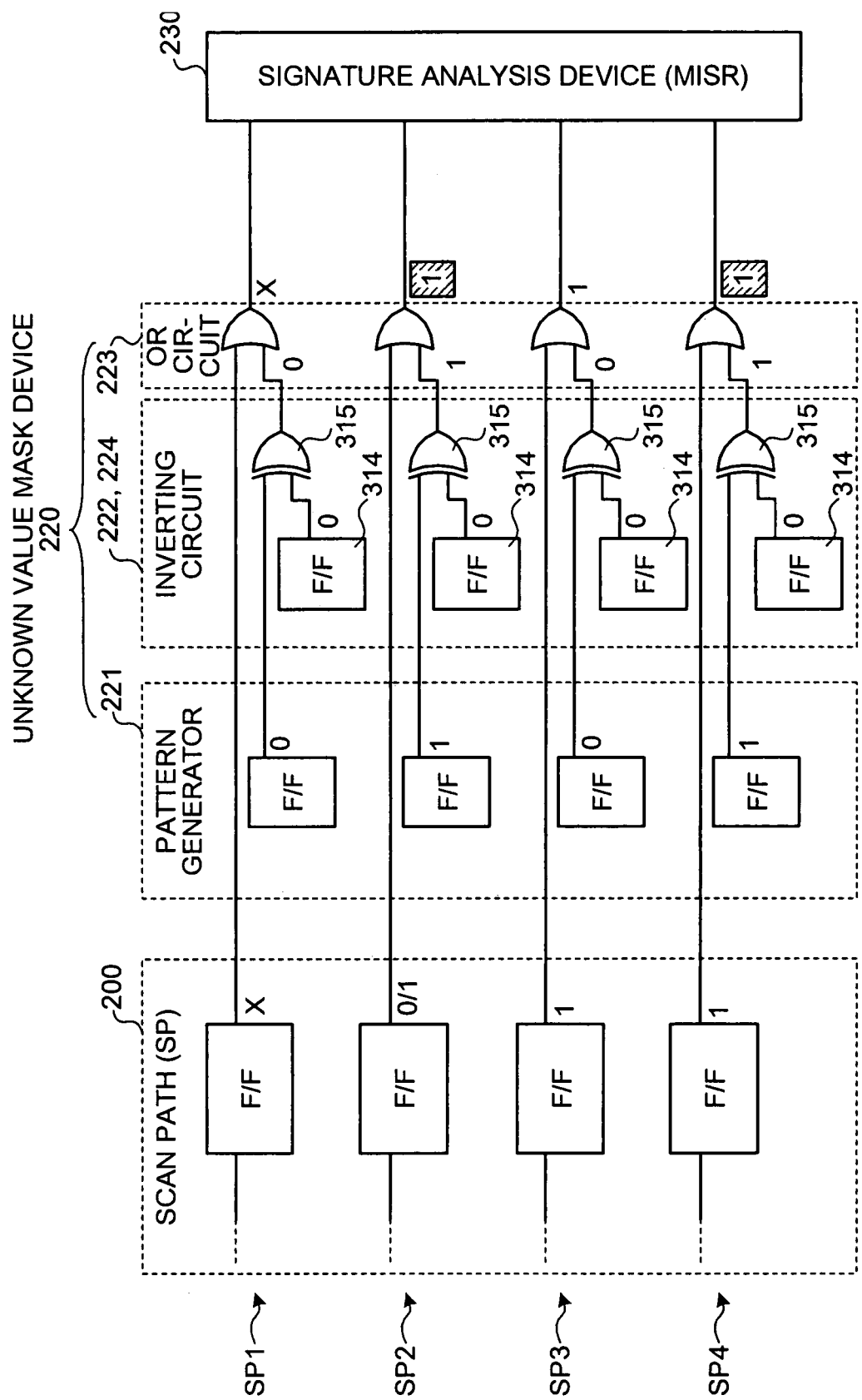

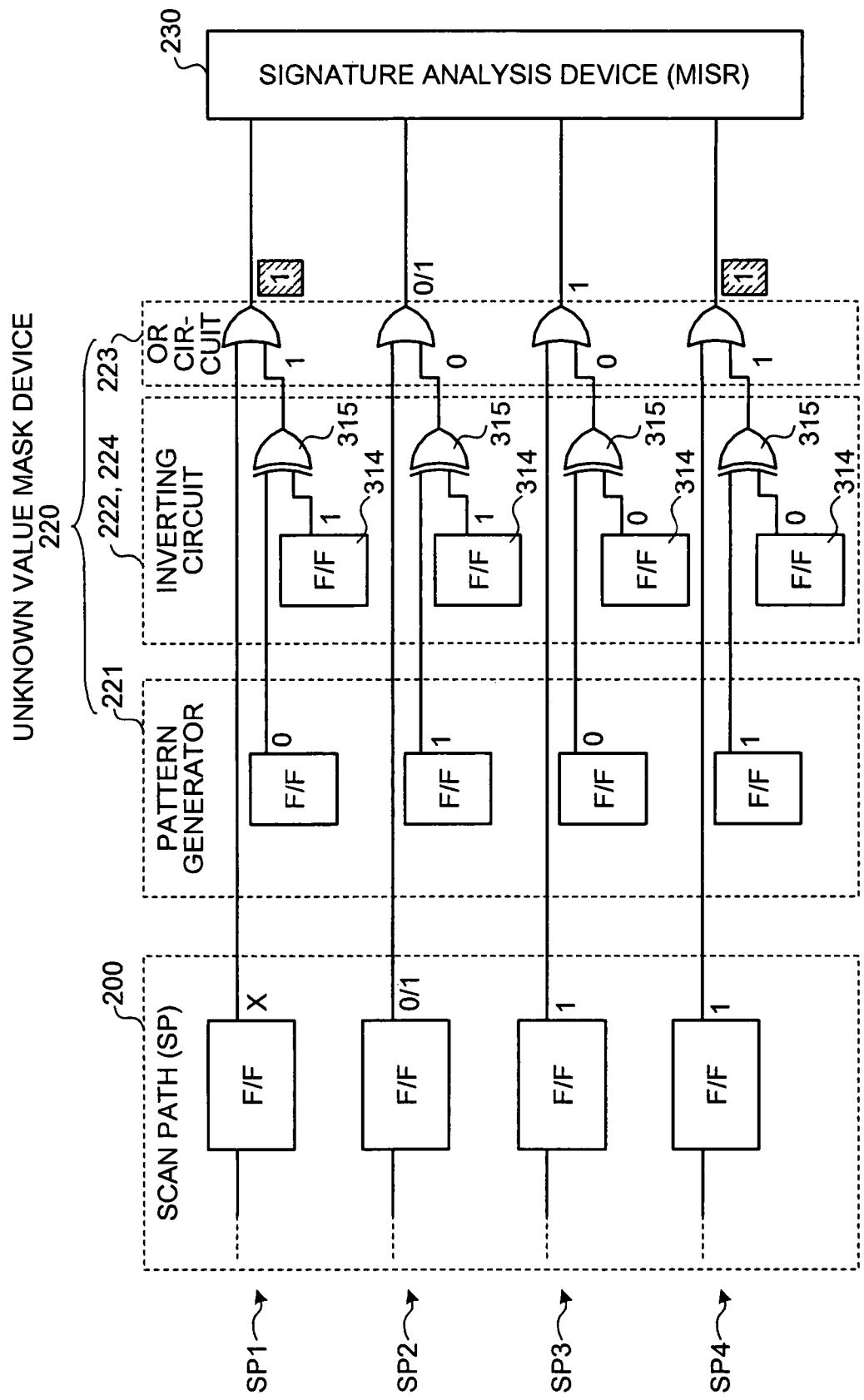

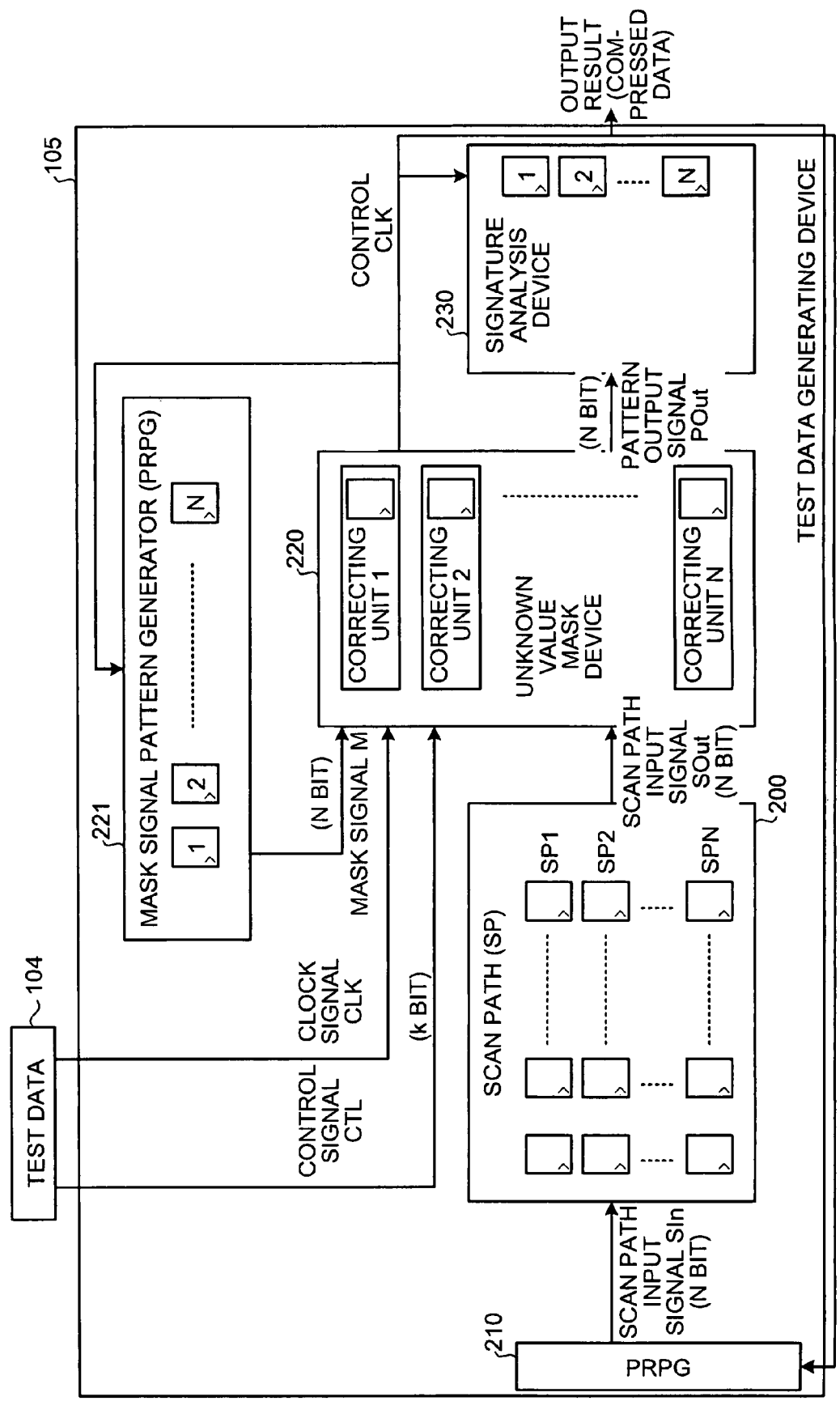

FIG.5

| CTL0 | CTL1~7 | OPERATION | |
|---|---|---|---|
| 0 | XXXXXXX | PATTERN SHIFT<br>ALL F/F IN UNKNOWN VALUE MASK DEVICE IS CLEARED TO 0 | 511 |
| 1 | 0000000 | F/F IN UNKNOWN VALUE MASK DEVICE CORRESPONDING TO SCAN PATH 0 IS SET TO 1 | 512 |
| 1 | 0000001 | F/F IN UNKNOWN VALUE MASK DEVICE CORRESPONDING TO SCAN PATH 1 IS SET TO 1 | 513 |
| ⋮ | ⋮ | ⋮ | |
| 1 | 1111111 | F/F IN UNKNOWN VALUE MASK DEVICE CORRESPONDING TO SCAN PATH 127 IS SET TO 1 | 514 |

FIG.6

| | SCAN PATH OUTPUT SIGNAL SOut | MASK SIGNAL M | CORRECT-ING UNIT F/F SETTING | PATTERN OUTPUT SIGNAL POut |
|---|---|---|---|---|
| SP0 | 0 | 1 | 0 | 1 |
| SP1 | X | 0 | 0 | X |
| SP2 | X | 1 | 0 | 1 |
| SP3 | 1/0 | 0 | 0 | 1/0 |
| SP4 | 0/1 | 1 | 0 | 1 |
| | ⋮ | ⋮ | ⋮ | ⋮ |

FIG.7

| | CTL1~7 | OPERATION | |
|---|---|---|---|
| 1 | 10000001 | 1 IS SET TO F/F1 | ~701 |
| 2 | 10000100 | 1 IS SET TO F/F4 | ~702 |

FIG.8

| | SCAN PATH OUTPUT SIGNAL SOut | MASK SIGNAL M | CORRECT-ING UNIT F/F SETTING | PATTERN OUTPUT SIGNAL POut | |
|---|---|---|---|---|---|
| SP0 | 0 | 1 | 0 | 1 | |
| SP1 | X | 0 | 1 | 1 | ~810 |
| SP2 | X | 1 | 0 | 1 | |
| SP3 | 1/0 | 0 | 0 | 1/0 | |
| SP4 | 0/1 | 1 | 0 | 1 | |
| ⋮ | ⋮ | ⋮ | ⋮ | ⋮ | |

FIG.9

| SCAN PATH OUTPUT SIGNAL SOut | MASK SIGNAL M | CORRECT-ING UNIT F/F SETTING | PATTERN OUTPUT SIGNAL POut |
|---|---|---|---|
| SP0: 0 | 1 | 0 | 1 |
| SP1: X | 0 | 1 | 1 |
| SP2: X | 1 | 0 | 1 |
| SP3: 1/0 | 0 | 0 | 1/0 |
| SP4: 0/1 | 1 | 1 | 0/1 | ~820
| ⋮ | ⋮ | ⋮ | ⋮ |

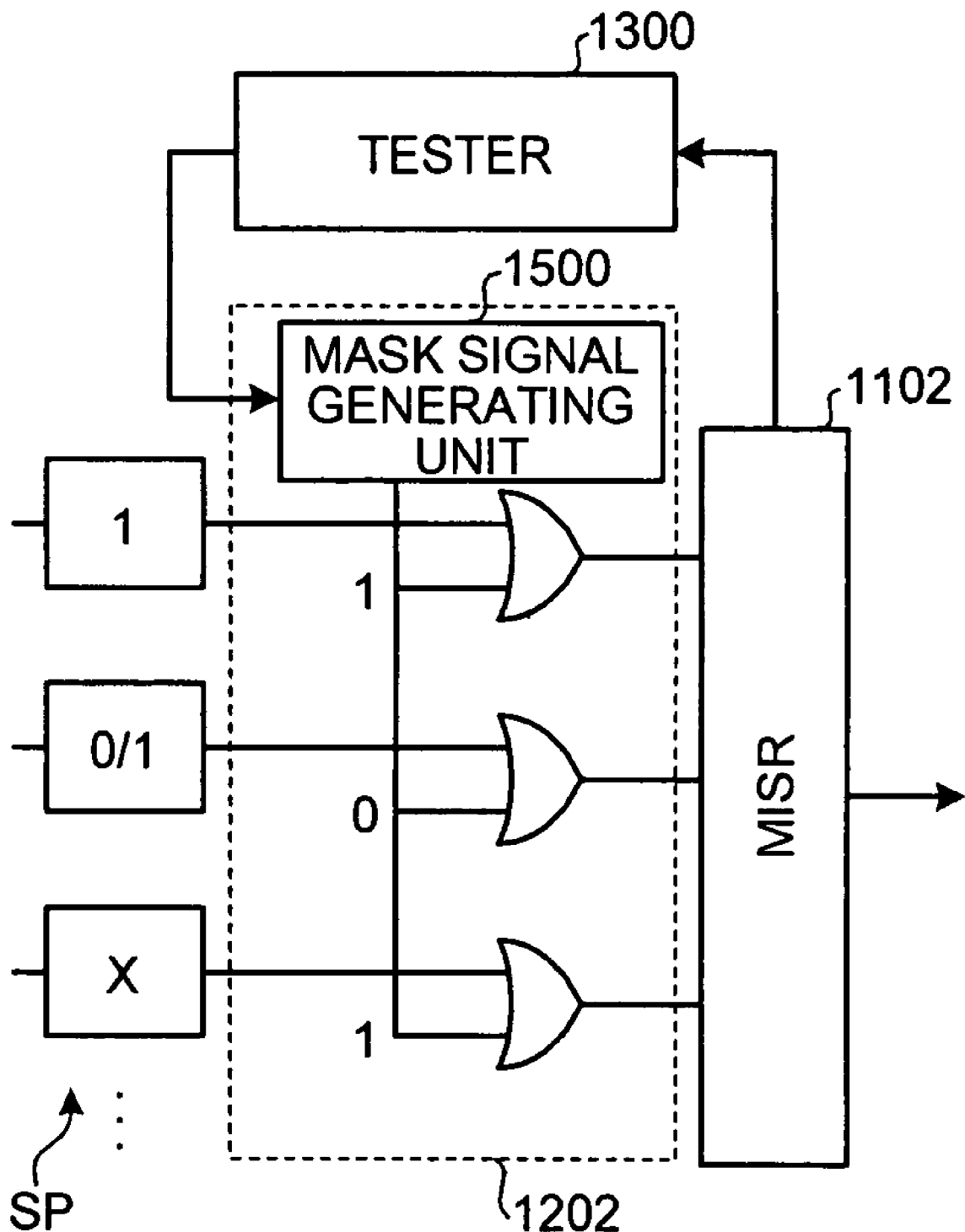

SEMICONDUCTOR INTEGRATED CIRCUIT, TEST DATA GENERATING DEVICE, LSI TEST DEVICE, AND COMPUTER PRODUCT

CROSS-REFERENCE TO RELATED APPLICATIONS

This application is based upon and claims the benefit of priority from the prior Japanese Patent Application No. 2006-128141, filed on May 2, 2006 and Japanese Patent Application No. 2007-064035, filed on Mar. 13, 2007, the entire contents of which are incorporated herein by reference.

BACKGROUND OF THE INVENTION

1. Field of the Invention

The present invention relates to a technology for testing a semiconductor integrated circuit.

2. Description of the Related Art

Conventionally, detection of a production defect of an integrated circuit is performed by inputting an appropriate signal value to an input pin of the integrated circuit using a tester such as automatic test equipment (ATE), and by comparing the signal value at the output pin with an expected value. The signal value of the input pin and the expected value of the output pin are collectively called a test pattern. When the integrated circuit includes sequential circuit elements (flip flop (F/F), latch and RAM), the complexity of preparing this test pattern increases remarkably. Therefore, scan design called deterministic stored pattern test (DSPT) is widely employed for the integrated circuit.

FIG. 10 is an explanatory diagram of a DSPT. In the DSPT, test patterns TP (input pattern TPin and output pattern TPout) generated by an automatic test pattern generator (ATPG) are stored into a tester (not shown).

A shift register is formed by sequential circuit elements (mainly F/F) in the integrated circuit 1000. This shift register is called a scan path SP. For convenience, four scan paths SP are formed in FIG. 10. A desired input pattern TPin is shifted in from the input pin 1001 at a test, and the value of the shift register is read from the output pin 1002 to the outside after clock impression. Thus, in the DSPT, setting and reading per test pattern TP are repeated to all the sequential circuit elements structuring the scan paths SP in the integrated circuit 1000.

Recently, along with the increased integration of the integrated circuit, the number of sequential circuit elements included in the inside thereof becomes extremely large. Therefore, the application of the DSPT mentioned above comes to be troublesome in the points of increased test time and test data amount. Therefore, a built-in self-test (BIST) comes to be performed.

FIG. 11 is an explanatory diagram of a BIST. In an integrated circuit 1100, a pseudo random number pattern generator 1101 is arranged at the input side of the scan path SP, and a signature analysis device 1102 is arranged at the output side. When a desired control signal is input to an input pin 1111, the pattern generated by the pseudo random number pattern generator 1101 is output to the scan path SP of the integrated circuit 1100, and the output result from the scan path SP is verified by and stored in the signature analysis device 1102. The signature analysis device 1102 compresses and outputs the output result from the scan path SP to the output pin 1112. In other words, it is verified whether this output is identical to the expected value.

To the pseudo random number pattern generator 1101 and the signature analysis device 1102, a linear feedback shift register (LFSR) is frequently used. Since the signature analysis device 1102 compresses and stores the output result as signature, it is called a multiple input signature register (MISR). In the BIST, the pseudo random number pattern generator 1101 is included in the integrated circuit 1100. Accordingly, it is possible to generate quite a large number of test patterns in a short time, and to greatly reduce the test data amount to load to the tester for compressing the test result by the signature analysis device (MISR) 1102.

The MISR is used for compressing the output data in the BIST. Once a value indicating an unknown state (hereinafter, "unknown value") is taken in, all the registers in the MISR become indefinite, and test cannot be performed. In general, the sequential circuit elements including RAM in the integrated circuit are in unknown state when power is turned on. The process of automatic test pattern generator (ATPG) is simplified by handling the output of the circuit portion that cannot be tested as unknown value. Therefore, it is necessary to handle unknown state. Furthermore, there are cases when it is necessary to cope with unknown values output according to a large amount of unknown states.

As one of countermeasures against an unknown value, there is a mask circuit that masks an unknown value. In general, the mask circuit uses one of three kinds of circuits, a bulk mask, an individual mask, and a random number mask. In the case using any of the mask circuits, there occur different problems according to actions of the respective mask circuits.

FIG. 12 is a circuit diagram of a bulk mask. An unknown value mask device 1202 is a bulk mask circuit. The bulk mask circuit masks all the scan paths SP collectively according to the test data (control signal) input from a tester 1300.

FIG. 13 is a circuit diagram of an individual mask. An unknown value mask device 1202 is an individual mask circuit. The individual mask circuit masks a scan path SP among plural scan paths SP according to test data (control signal) input from the tester 1300. In the case of the individual mask circuit, there is an advantage that it is possible to mask only the unknown value without masking the fault value. However, at every moment when the unknown value at one portion is masked, it is necessary to input test data for one pattern. As a method to perform masking by this method, bist aided scan test (BAST) technology is proposed (for example, Japanese Patent Laid-Open Publication No. 2002-236144).

FIG. 14 is a circuit diagram of a random number mask. The unknown value mask device 1202 is a random number mask circuit. In the random number mask circuit, test data (control signal) output from the tester 1300 is input to the mask signal generating unit 1500. The mask signal generating unit 1500 includes a pseudo random pattern generator and a control circuit. In this mask signal generating unit 1500, the pattern generated by the pseudo random pattern generator is controlled by the control circuit, and the mask signal to each scan path SP is generated. Accordingly, the mask is made to scan path SP with small test data amount by the random number mask.

In the case of the bulk mask, there is an advantage that the mask is made with small test data amount. However, even the value of F/F that is influenced by fault (hereinafter, "fault value") may be masked when the unknown value is masked. When the fault value is masked, test quality may be deteriorated.

Furthermore, in the case of the individual mask, along with the increase of the circuit scale of the integrated circuit, the number of scan paths SP increases. Accordingly, the data amount per once to specify one scan path increases, and the number of the scan paths SP to be masked increases. And the scan data of the data amount of each time to specify one scan path×the number of unknown values is required. As a result, a large amount of test data for masking the unknown value mask device 1202 is required.

Furthermore, in the case of the random number mask, since the random number to be used for the mask is the pattern that occurs at random, it is not guaranteed to mask all the unknown values. In other words, when the unknown value cannot be masked by the mask signal generated by the mask signal generating unit 1500, it is necessary to change patterns of the mask signal. Therefore, the mask signal must be generated by new random number once again. As a result, it is difficult to generate such a test pattern as to mask all the unknown values, and a high quality test can not be provided.

SUMMARY OF THE INVENTION

It is an object of the present invention to at least solve the problems in the conventional technology.

A semiconductor integrated circuit according to an aspect of the present invention includes plural shift registers that receive plural test patterns randomly generated, and a mask device that masks, among the shift registers, a target shift register specified by a mask pattern randomly generated. When a shift register other than the target shift register outputs an unknown value, the mask device masks the shift register according to a control signal.

A test-data generating device according to another aspect of the present invention, generates test data using design data of a semiconductor integrated circuit that includes plural shift registers that receive plural test patterns randomly generated, a mask device that masks, among the shift registers, a target shift register specified by a mask pattern randomly generated, and a verification device that verifies a pattern output from the mask device. The test-data generating device includes a generating unit that generates, when a shift register other than the target shift register outputs an unknown value, a control signal to mask the shift register, and a storing unit that stores a combination of the control signal and an expected output value output from the verification device as the test data.

A test device according to still another aspect of the present invention performs a fault test using a test data generating device on a semiconductor integrated circuit that includes plural shift registers that receive plural test patterns randomly generated; a mask device that masks, among the shift registers, a target shift register specified by a mask pattern randomly generated; and a verification device that verifies a pattern output from the mask device, the test-data generating device including a generating unit that generates a control signal to control the mask device, and a storing unit that stores a combination of the control signal and an expected output value that is output from the verification device as test data. The test device includes a control unit that reads, when a shift register other than the target shift register outputs an unknown value, a control signal to mask an output of the shift register from the test data, to output to the mask device, and a detecting unit that detects a fault of the semiconductor integrated circuit by comparing an output value from the verification device and the expected output value included in the test data.

A test device according to still another aspect of the present invention includes a pattern generator that generates and outputs plural random test patterns to plural shift registers in a target integrated circuit, a mask device that receives plural signals output from the shift registers, masks a signal indicating an unknown state among the signals, and unmasks a signal indicating a fault among the signals to output the signals, and a verification device that compresses the signals output from the mask device.

A method according to still another aspect of the present invention is of generating test data using design data on a semiconductor integrated circuit that includes plural shift registers that receive plural test patterns randomly generated, a mask device that masks, among the shift registers, a target shift register specified by a mask pattern randomly generated, and a verification device that verifies a pattern output from the mask device. The method includes generating, when a shift register other than the target shift register outputs an unknown value, a control signal to mask the shift register, and storing a combination of the control signal and an expected output value output from the verification device as the test data.

A method according to still another aspect of the present invention is of performing a fault test using a test data generating device on a semiconductor integrated circuit that includes plural shift registers that receive plural test patterns randomly generated, a mask device that masks, among the shift registers, a target shift register specified by a mask pattern randomly generated, and a verification device that verifies a pattern output from the mask device, the test data generating device including a generating unit that generates a control signal to control the mask device, and a storing unit that stores a combination of the control signal and an expected output value that is output from the verification device as test data. The method includes reading, when a shift register other than the target shift register outputs an unknown value, a control signal to mask the shift register from the test data, outputting the control signal to the mask device, and detecting a fault of the semiconductor integrated circuit by comparing a value output from the verification device and the expected output value included in the test data.

A computer-readable recording medium according to still another aspect of the present invention stores therein a program for generating test data using design data on a semiconductor integrated circuit that includes plural shift registers that receive plural test patterns randomly generated, a mask device that masks, among the shift registers, a target shift register specified by a mask pattern randomly generated, and a verification device that verifies a pattern output from the mask device. The program causes a computer to execute generating, when a shift register other than the target shift register outputs an unknown value, a control signal to mask the shift register, and storing a combination of the control signal and an expected output value output from the verification device as the test data.

A computer-readable recording medium according to still another aspect of the present invention stores therein a program for performing a fault test using a test-data generating device on a semiconductor integrated circuit that includes plural shift registers that receive plural test patterns randomly generated, a mask device that masks, among the shift registers, a target shift register specified by a mask pattern randomly generated, and a verification device that verifies a pattern output from the mask device, the test-data generating device including a generating unit that generates a control signal to control the mask device, and a storing unit that stores a combination of the control signal and an expected output value that is output from the verification device as test data. The program causes a computer to execute reading, when a shift register other than the target shift register outputs an unknown value, a control signal to mask the shift register from the test data, outputting the control signal to the mask device, and detecting a fault of the semiconductor integrated circuit by comparing a value output from the verification-device and the expected output value included in the test data.

BRIEF DESCRIPTION OF THE DRAWINGS

FIG. 1A is a schematic diagram of an LSI test system according to the present invention;

FIG. 3A is a circuit diagram of a semiconductor integrated circuit according to an embodiment;

FIG. 3B is a circuit diagram of an unknown value mask device 220 after correction;

FIG. 4A is a block diagram of design for test (DFT) circuit included in an LSI according to the embodiment;

FIG. 5 is a code list of control signal CTL;

FIG. 6 is a diagram of an initial state of the DFT circuit in the case when a certain test pattern is input to a target circuit;

FIG. 7 is a data string of an example of the control signal CTL stored as test data;

FIG. 8 is a diagram of a first step process by the control signal CTL;

FIG. 9 is a diagram of a second step process by the control signal CTL;

FIG. 14 is a circuit diagram of a random number mask.

DETAILED DESCRIPTION OF THE PREFERRED EMBODIMENTS

Figure 1B:
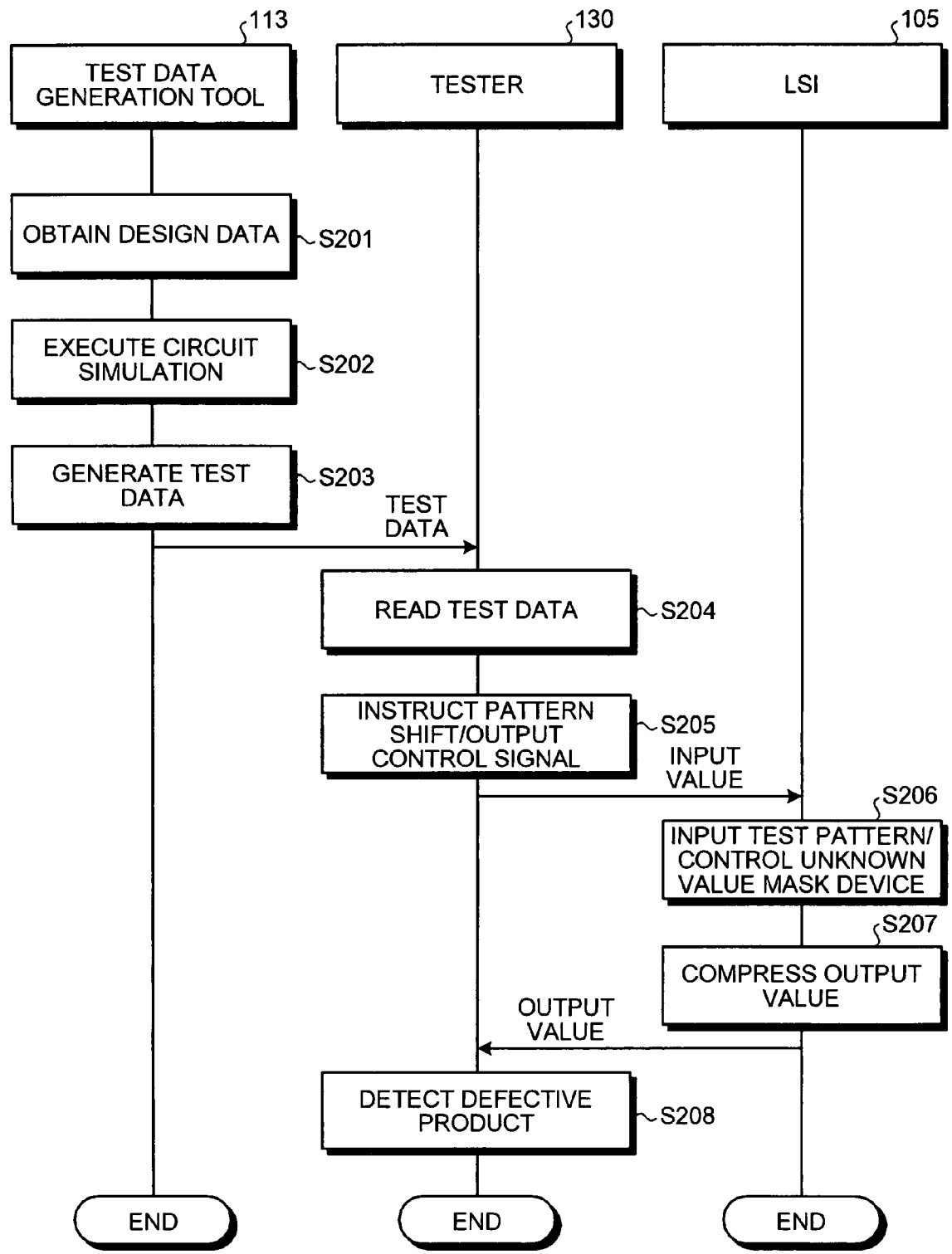
FIG. 1B is a flowchart of an LSI test performed by an LSI test system.

Exemplary embodiments according to the present invention will be explained in detail with reference to the accompanying drawings.

FIG. 1A is a schematic diagram of the LSI test system according to the present invention. An LSI test system 100 is a system that performs a test for detecting a defective product in an LSI 105 manufactured based on a specified specification 101. The LSI test system 100 includes an information processor 110, an LSI manufacturing equipment 120, and a tester 130. In the LSI test system 100, the LSI 105 is tested through three processes of design, manufacture, and test, using the above respective apparatuses.

The information processor 110 runs software for an LSI manufacture and an LSI test, and generates an LSI manufacture data and an LSI test data. In other words, the information processor 110 performs a design process in the LSI test system 100. More specifically, the information processor 100 includes a design tool 111 and a design for test (DFT) tool 112 as LSI manufacture software, and a test data generation tool 113 as LSI test software.

The design tool 111 generates a design data 102 for manufacturing an LSI to meet requirements set in the specifications 101. The design data 102 is the design data of the LSI that performs the process to meet requirements set in the specifications 101. In the LSI test, the LSI that does not operate normally is detected as a defective product. The design data 102 is especially called the design data of "target circuit".

The DFT tool 112 generates, from the design data 102, a design data 103 of the LSI further including a DFT circuit. The DFT circuit is the circuit to be added for improving the test efficiency of the target circuit. More specifically, the DFT circuit includes a process circuit for inputting a test input value to the target circuit, and a process circuit for verifying the output result from the target circuit.

In the case of the LSI test system 100, as the DFT circuit of LSI, a pattern generator that automatically generates an input value (test pattern) to the shift register as the target circuit, an MISR that compresses an output value from the shift register, and an unknown value mask device that prevents an unknown value from being input to the MISR are arranged (details of the DFT circuit are described later). Thus, the DFT tool 112 designs LSI in which the DFT circuit is arranged on the target circuit. Accordingly, the design data 103 generated by the DFT tool 112 is referred to as the design data especially of "target circuit+DFT circuit".

The test data generation tool 113 generates, from the design data, test data 104 to be used for the LSI test 103. In the test data generation tool 113, the input/output simulation of the target circuit+DFT circuit is carried out. From this simulation result, the test data 104 used for the test of the LSI manufactured by the design data 103 is generated.

In the case of the LSI test system 100, as mentioned above, the pattern generator that automatically generates test patterns is arranged in the DFT circuit. When an unknown value is output from the shift register, the unknown value is masked by the mask device so as not to be input to the MISR. Accordingly, the test data 104 includes the control signal of the unknown value mask device of the pattern shift of the test pattern and at each pattern, and the output expected value for comparing with the output value from the LSI 105.

The LSI manufacturing equipment 120 manufactures the LSI 105 from the design data (target circuit+DFT circuit) 103 generated by the DFT tool 112. In other words, the LSI manufacturing equipment 120 carries out the manufacture process in the LSI test system 100. As mentioned in the explanation of the DFT tool 112, the design data 103 is the design data for manufacturing the LSI including the target circuit and the DFT circuit for testing the target circuit. Accordingly, the LSI 105 manufactured by the LSI manufacturing equipment 120 includes the target circuit and the DFT circuit. In the circuit simulation carried out by the above test data generation tool 113, the process of the LSI 105 is carried out virtually on software.

The test data 104 generated by the test data generation tool 113 is stored in the tester 130. The tester 130 refers to the stored test data 104, and performs the defect test of the LSI 105. In other words, the tester 130 carries out the test process in the LSI test system 100.

More specifically, the tester 130 refers to the test data 104, and inputs the pattern shift instruction of the test pattern to be generated by the pattern generator of the LSI 105, and the control signals of the unknown value mask device according to the test pattern. In the LSI 105, the test pattern input from the pattern generator and the output value masked by the unknown value mask device are compressed by the MISR, and output to the tester 130 as an output value. The tester 130 judges whether the LSI 105 is good or defective using the test result 106 obtained by comparing the output value from the LSI 105 and the output expected value of the test data 104.

FIG. 1B is a sequence diagram of the procedure of the LSI test by the LSI test system. When obtaining the design data (target circuit+DFT circuit) 103 (step S201), the test data generation tool 113 of the information processor 110 executes the circuit simulation based on the design data 103 (step S202), and generates the test data 104 from the simulation at the step S202 (step S203).

The tester 130 performs the test of the LSI 105 using the test data 104. The test data generated by the test data generation tool 113 is read out (step S204). Then, the tester refers to the test data 104, and instructs the pattern shift to the random number generator of the LSI 105, and outputs a control signal according to the test pattern to the unknown value mask device (step S205).

The pattern shift instruction and the control signal are input to the LSI 105 as the input values from the tester 130. In response to these input values, the pattern generator of the LSI 105 inputs the test pattern to the target circuit (shift register), and controls the unknown value mask device using the control signal (step S206). In the LSI 105, the value according to the test pattern by the process at the step S205 is output, and this output value is compressed (step S207). The compressed output value is read to the tester 130.

The tester 130 reads out the output value from the LSI 105, and compares the output value with the output expected value included in the test data 106, and performs the defective product detection (step S208), and the series of LSI test procedures end.

The LSI test system 100 according to the present invention performs the test on the LSI 105 according to the procedures explained above. Accordingly, the information processor 110 that generates the test data 104 by the test data generation tool 113 functions as a test data generator, and the tester 130 that performs the test on the LSI 105 using the generated test data 104 functions as the LSI test device. The tester 130 is not limited to exclusive hardware, but may be realized as an information processor storing therein an exclusive tool that carries out the process performed by the tester 130.

The requirements of the LSI test and the DFT circuit will be explained. In general, the important value of scan path compressed by MISR of the LSI test device is the value of F/F to which the influence of the fault reaches in test pattern of ATPG (hereinafter, "fault value"). In ATPG, the fault detected once is removed. Therefore, the rate of the fault value in the later test pattern becomes extremely small.

The value of F/F (hereinafter, "expected value") to which the influence of the fault dose not reach may be masked in the same manner as the unknown value. Therefore, suppose the circuit to mask an input to MISR using a special pattern generator (pseudo random pattern generator (PRPG)). In this case, stochastically half of the scan path values are masked, but a reverse circuit to correct the value of the pattern generator is added so that the unknown value among them is masked, and the fault value is not masked. In the reverse circuit, there are F/Fs corresponding to respective scan paths, and when the value of F/F is 1, the mask state from the pattern generator is reversed.

In this F/F setting, the control signal (code) input from external input is used, and to set F/F corresponding to one of N scan paths, k-bit code expressed by [$\log_2 N$] is used. Here, k is the smallest integer that is not smaller than $\log_2 N$. Since the rate of fault values and unknown values is small, and the number of cases when change of mask/no mask becomes necessary by the pattern generator becomes small, it is possible to make small the number of codes input from the outside.

When an output verifier of BIST (especially MISR) is used, it is important to prevent the input of the unknown value to MISR, and in some structure of integrated circuit, it is necessary to cope with many unknown states. In the recent testdata compression technology combining BIST and STPG, the mask function in unknown state is proposed. However, it is known that the compression ratio becomes extremely deteriorated when many unknown states are handled. Using the technology according to the present invention makes it possible to mask the unknown value without deteriorating the compression ratio even in many unknown states. An embodiment of a semiconductor integrated circuit LSI test where a DFT circuit in consideration of these requirements is arranged will be explained.

Figure 2A:
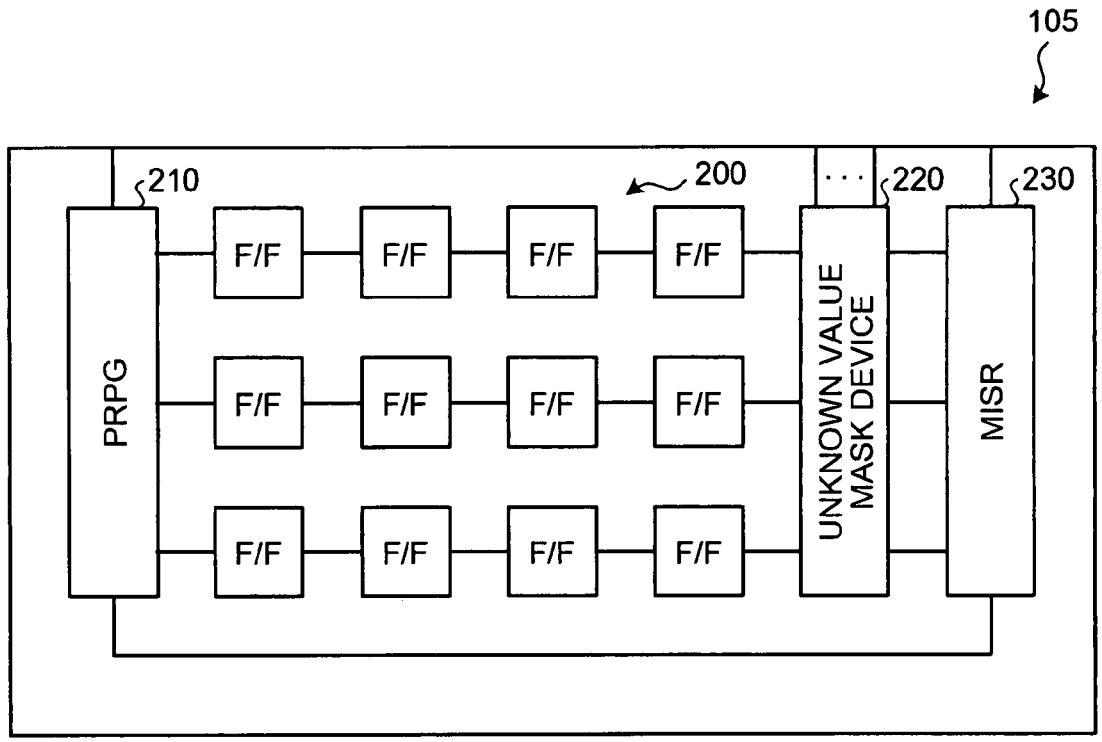
FIG. 2A is a block diagram of an LSI test device according to the present invention.
Figure 2B:
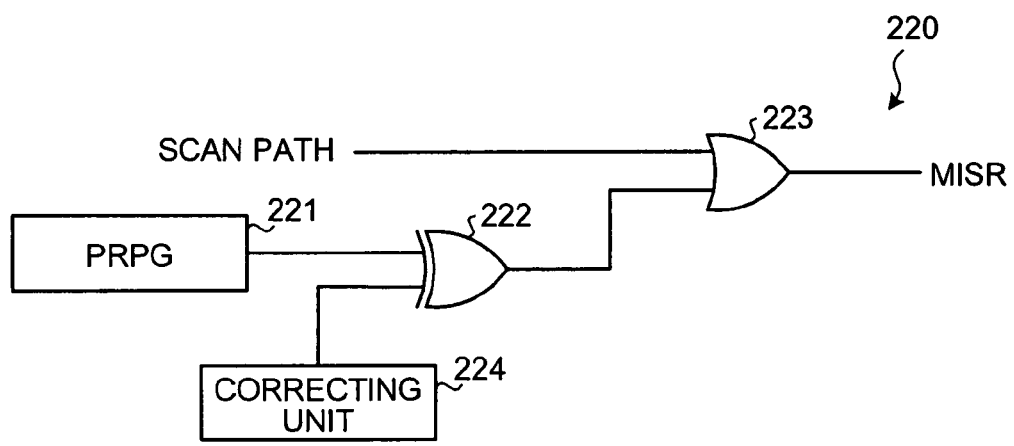
FIG. 2B is a circuit diagram of an unknown value mask device of the LSI test device.

FIG. 2A is a block diagram of the structure of the LSI including the DFT circuit. The LSI 105 includes a scan path (SP) 200 of a shift register corresponding to a target circuit, a PRPG (pattern generator) 210 corresponding to the DFT circuit, a pattern correcting device 220, and an MISR 230.

In the DFT circuit arranged in the LSI 105, the PRPG 210 generates a test pattern to be input to the scan path 200. The unknown value mask device 220 masks the output of the scan paths designated as mask targets, among the output of the scan paths 200. The MISR 230 compresses and outputs the output value output from the scab paths 200 to the tester 130 (refer to FIG. 1). Not the output value that passes the shift register but a fixed value (for example, "1") is output from the shift register 200 that is a mask target.

FIG. 2A is a circuit diagram of the detailed structure of the unknown value mask device. The unknown value mask device 220 includes a PRPG 221, an EXOR circuit 222, an OR circuit 223, and a correcting unit 224.

The PRPG 221 generates a random pattern. The generated pattern is output to the EXOR circuit 222. Normally, "0" is output from the correcting unit 224, and if "0" is output from the PRPG 221, "0" is output from the EXOR circuit 222. On the other hand, if "1" is output from the PRPG 221, "1" is output from the EXOR circuit 222.

To the OR circuit 223, the output value from the scan path 200, and the output value from the EXOR 222 are input. In other words, if "1" is input from the EXOR 222, irrespective of the input from the scan path, the fixed value "1" is output to the MISR 230, and the masked state gets in. Furthermore, to the correcting unit 224, the control signal is input according to the test pattern.

When the control signal is input to the correcting unit 224, "1" is output to the EXOR 222. When "1" is input from the correcting unit 224, the output of the EXOR 222 becomes the inverted value of the output in the case when "0" is input from the correcting unit 224. In other words, it changes to the outputs from EXOR 222 "0→1", "1→0". Accordingly, the input to the OR 223 inverts, and the masked scan path 200 becomes unmasked state, and the scan path 200 in the unmasked state becomes in masked state.

In the embodiment according to the present invention, LSI test is performed using a DFT circuit equipped with the unknown value mask device 220 having the structure explained above. FIG. 3A is a circuit diagram of a part of the semiconductor integrated circuit according to the embodiment of the present invention. The scan path 200, the indefinite device 220, and the signature analysis device (MISR) 230 shown in FIG. 3A are concrete examples of the respective structures explained in FIG. 1.

The scan path SP1 outputs the transmission signal of the unknown value "X", and the scan path SP2 outputs the transmission signal of the fault value "0/1". The scan paths SP3 and SP4 output transmission signals of fixed values, respectively. The output of SP4 is masked, but since the fixed value has no relation with fault detection, there is no problem even if it is masked. Accordingly, in the LSI 105, the transmission signal "X" of the scan path SP1 need to be masked, and the transmission signal "0/1" of the scan path SP2 need to be unmasked, to be output to the signature analysis device 230.

The unknown value mask device 220 includes an exclusive pattern generator (PRPG) 221, inverting circuits (EXOR, correcting unit) 222 and 224 that inverts the output value of the PRPG 221, and an OR circuit 223 that outputs the logic sum of the output value of the scan paths SP1 to SP4 and the output value from the inverting circuit 222.

The inverting circuits 222 and 224 include an F/F (initial state thereof is "0") 314 whose value is set based on the control signal (code) from the outside (tester 130), and an XOR circuit 315 that inputs the output value form the F/F 314 and the output value from the PRPG 221. The OR circuit 223 takes the logic sum of the output value from the XOR circuit 315 and the output values from the scan paths SP1 to SP4.

With the OR circuit 223, the output of the scan paths SP1 to SP4 to be output to the signature analysis device 230 is masked when the output value of the PRPG 221 is 1 (shown in rectangular of hatching in FIG. 3A). Since the output value of the PRPG 221 is a pseudo random pattern, almost half of the scan paths SP1 to SP4 are masked. FIG. 3A shows that the transmission signal "X (unknown value)" of the first top scan path SP1 is not masked, and the transmission signal "0/1 (fault value)" of the second scan path SP2 is masked. In this case, it is necessary to invert the mask states about the two scan paths SP1 and SP2, and the control signals to set the F/F 314 in the inverting circuits 222 and 224 are necessary.

These control signals are input by the tester 130 referring to the test data 104. FIG. 3B is a circuit diagram of the unknown value mask device 220 after correction. In FIG. 3B, to invert the mask states about the above two scan paths SP1 and SP2, the control signal to set the F/F 314 in the inverting circuits 222 and 224 about the scan paths SP1 and SP2 to "1" is input. As a result, it is possible to securely mask the unknown state, and input the fault value to which the influence of fault reaches to the signature analysis device 230 without masking it.

By performing the correction as shown in FIG. 3B, the LSI 105 can mask the unknown value, and output all the fault values. Accordingly, when the LSI test is carried out as LSI test device with the tester 130 connected, the signature analysis device 230 allows to attain the high compression of transmission signals from plural shift registers 200. Furthermore, controlling the unknown value mask device 220 and preventing masking of signals indicating faults leads to attain high quality of the output result from the signature analysis device 230.

FIG. 4A is a block diagram of the structure of the DFT circuit included in an LSI according to the present embodiment. The LSI 105 includes a scan path 200, a PRPG 210, an unknown value mask device 220, a signature analysis device (MISR) 230, and a mask signal pattern generator (PRPG) 221.

The PRPG 210 generates the test pattern to be input to the scan path 200 as a test circuit. The test pattern generated by the PRPG 210 is input to the scan path (SP) 200 as scan path input signal SIn. Since test patterns generated at one time are input to respective scan path (SP) 200 by one bit, it becomes the value of the same number of bits as the number (herein N) of scan path (SP) 220. Accordingly, scan path input signal SIn of N bit is output from the PRPG 210.

The scan path input signal SIn input to the scan path (SP) 200 is processed according to circuit structure of each scan path SP (SP1 to SPN), and output as N-bit scan path output signal SOut.

The unknown value mask device 220 includes N units of correcting units, and performs either process to pass one bit of the scan path output signal SOut input from the scan path (SP) 200, or to output fixed value irrelative to the scan path output signal SOut. In other words, the unknown-value mask device 220 functions as a mask processing unit to the scan path output signal SOut.

The unknown value mask device 220, when masking the scan path output signal SOut, controls the correcting unit based on the mask signal M input from the mask signal pattern generator (PRPG) 221 described later. In other words, it is controlled based on the mask signal M which correcting unit should mask the scan path output signal SOut. Such a mask processing, when an unknown value is output as the scan path output signal SOut, leads to prevent the unknown value from being output to the signature analysis device 230. Accordingly, from the unknown value mask device 220, N-bit pattern output signal POut with the unknown value masked is output.

However, in the unknown value mask device 220, in initial state, only the mask process performed by the correcting unit is controlled based on the mask signal M generated at random. The mask signal M is only a pattern generated at random by the mask signal generator (PRPG) 221, and without adjustment, it cannot mask unknown value, masks fault value, and the output result for precise LSI test cannot be achieved.

Therefore, the unknown value mask device 220 has a function to adjust the correction contents of the correcting unit, in other words, which path is masked and which path is passed without being masked. What realizes this function is the clock signal CLK and the control signal CTL input from the tester 130. The clock signal CLK is the signal that repeats the same waveform at a predetermined cycle. The process in the LSI 105 is performed based on the clock signal CLK.

The control signal CTL is the signal to specify whether to mask or to unmask the scan path output signal SOut output from the designated path among N scan paths (SP) 200. When mask is applied or mask is released, it is necessary not to perform scan path pattern shift operation, and shift operation of the PRPG 210, the signature analysis device (MISR) 230 and the mask signal pattern generator (PRPG) 221. The control signal CTL realizes these functions too. Accordingly, the control signal CTL includes the value of k (=1+[$\log_2 N$]) bits including 1 bit signal to control pattern shift and shift, and [$\log_2 N$] bit signal indicating the address of the correcting unit in the unknown value mask device 220.

Accordingly, for example when the number of the scan paths (SP) 200 is four, since address of each scan path (SP) 200 can be expressed by 2-bit signal, the control signal CTL becomes 3-bit signal (CTL0 to CTL2). When the scan paths (SP) 200 is eight, since address of each scan path (SP) 200 can be expressed by 3-bit signal, the control signal CTL becomes 4-bit signal (CTL0 to CTL3).

By the later half of the address portion of the control signal CTL, the process of the designated correcting unit can be inverted. More specifically, the correcting unit can be adjusted based on the mask signal M so that the path that has not been masked though the path has output an unknown value can be masked, and that the path that has been masked though it has output fault value can be unmasked.

When the adjustment of the correcting unit is finished, the control signal CTL for pattern shift is input from the tester 130. By this control signal CTL, the control CLK becomes valid. This control CLK is input to the input pattern generator (PRPG) 210. In the PRPG 210, when the control CLK is input, the test pattern is shifted, and new scan path input signal SIn is input to the scan path (SP) 200. Furthermore, the control CLK is input, besides to the PRPG 210, to the signature analysis device 230 and the mask signal pattern generator 221, and shift operation is carried out by process contents of each function unit. While the correcting unit is adjusted, this control CLK does not function.

The signature analysis device 230 compresses the pattern output signal POut output from the unknown value mask device 220. This compression interval is determined by the input of the above control CLK as trigger. Compressed data is output to the tester 130, and compared with the output expected value.

The mask signal pattern generator (PRPG) 221 generates the mask signal M indicating the mask pattern in the unknown value mask device 220. The mask pattern is the pattern indicating of which scan path (SP) 220 a signal should be masked, among scan path output signal SOut output from N scan paths. The mask signal pattern generator (PRPG) 221, with the input of the control CLK from the unknown value mask device 220 as a trigger, generates and outputs the mask signal M to the unknown value mask device 220.

The mask signal is N-bit binary data. For example, when the number of the scan paths (SP) 200 is four, the mask signal M is 4-bit binary data such as "1010". When the mask signal M of "1010" is input to the unknown value mask device 220, the mask is applied in the correcting units 1 and 3 among the correcting units 1 to 4.

Furthermore, the mask signal pattern generator (PRPG) 221 generates the above pseudo random pattern. Accordingly, when the number of scan paths (SP) 200 is N, in the initial state, from the mask signal pattern generator (PRPG) 221, "101010...(N bit)" is output, and almost half of the scan path output signal SOut is masked. As a result, the number of paths whose correcting unit needs to be adjusted in the unknown value mask device 220 becomes smaller in the comparison with the conventional individual mask.

In the LSI 105, as mentioned above, the test data 104 including the control signal that controls pattern shift, and the control signal that specifies the correction portion of the unknown value mask device 220, is output from the tester 130. This test data, as explained in FIG. 1, must be generated by the test data generation tool 113 beforehand. To generate the test data 104 by the test data generation tool 113, first, LSI 105 shown in FIG. 4A is structured on software, and circuit simulation is carried out.

Figure 4B:
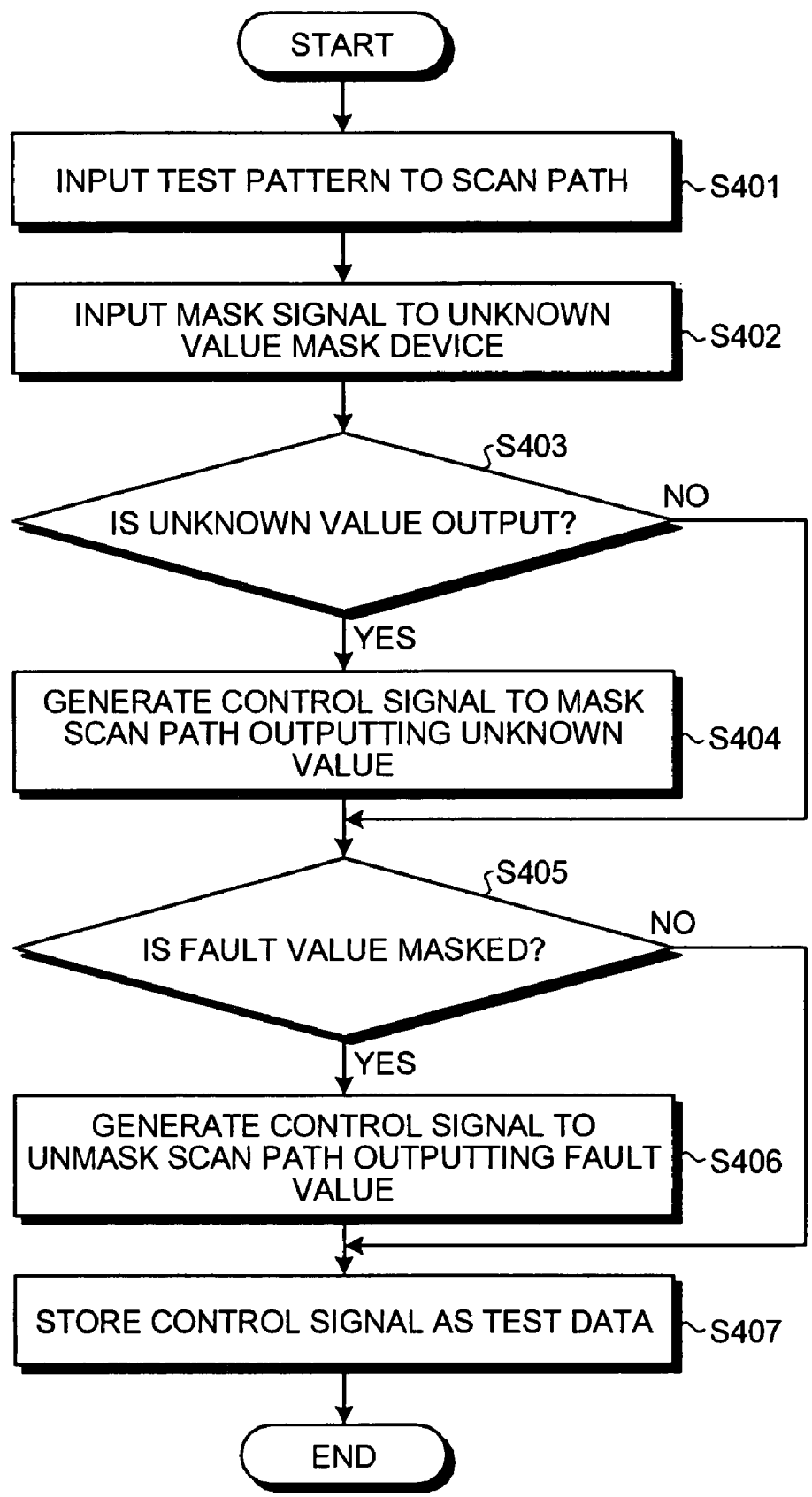
FIG. 4B is a flowchart of generating test data according to the embodiment.

FIG. 4B is a flowchart of generating test data. The test data generation tool 113 executes the procedures of the flowchart shown in FIG. 4B as circuit simulation. Test pattern generated by the input pattern generator (PRPG) 210 is input to the scan path (SP) 200 (step S401).

The mask signal M generated by the mask signal pattern generator 221 is input to the unknown value mask device 220 (step S402). Then, the scan path output obtained by the test pattern input at the step S401, and the mask signal M input at the step S402 are compared, and it is judged whether an unknown value is output from the unknown value mask device 220 (step S403).

At the step S403, when an unknown value is output (step S403: YES), a control signal to mask the scan path (SP) 200 that outputs the unknown value is generated (step S404), and the procedure shifts to the process at step S405. On the other hand, when an unknown value is not output (step S403: NO), the procedure shifts to the process at step S405.

The scan path output obtained by the test pattern input at the step S401, and the mask signal M input at the step S402 are compared, and it is judged whether the fault value is masked by the unknown value mask device 220 (step S405). When the fault value is masked (step S405: YES), a control signal to unmask the scan path (SP) 200 that outputs the fault value is generated (step S406). On the other hand, when the fault value is not masked (step S405: NO), the procedure shifts to the process at step S407.

Then, the control signal generated at the step S404 or S406 is stored as test data in connected with pattern shift (step S407), and the series of processes end. By performing the processes explained above, the test data generation tool 113 can generate the test data 104 applicable to the structure of the DFT circuit of the LSI 105.

The generated test data 104, at the LSI test, as explained in FIG. 1B, is read by the tester 130 and used for the LSI test. By referring to the test data 104, the unknown value mask device 220 of the DFT circuit can apply mask to only suitable path. Such a mask process leads to prevent the unknown value from being included in the output result and the compressed data from becoming the unknown value, and perform a high quality LSI test.

Figure 4C:
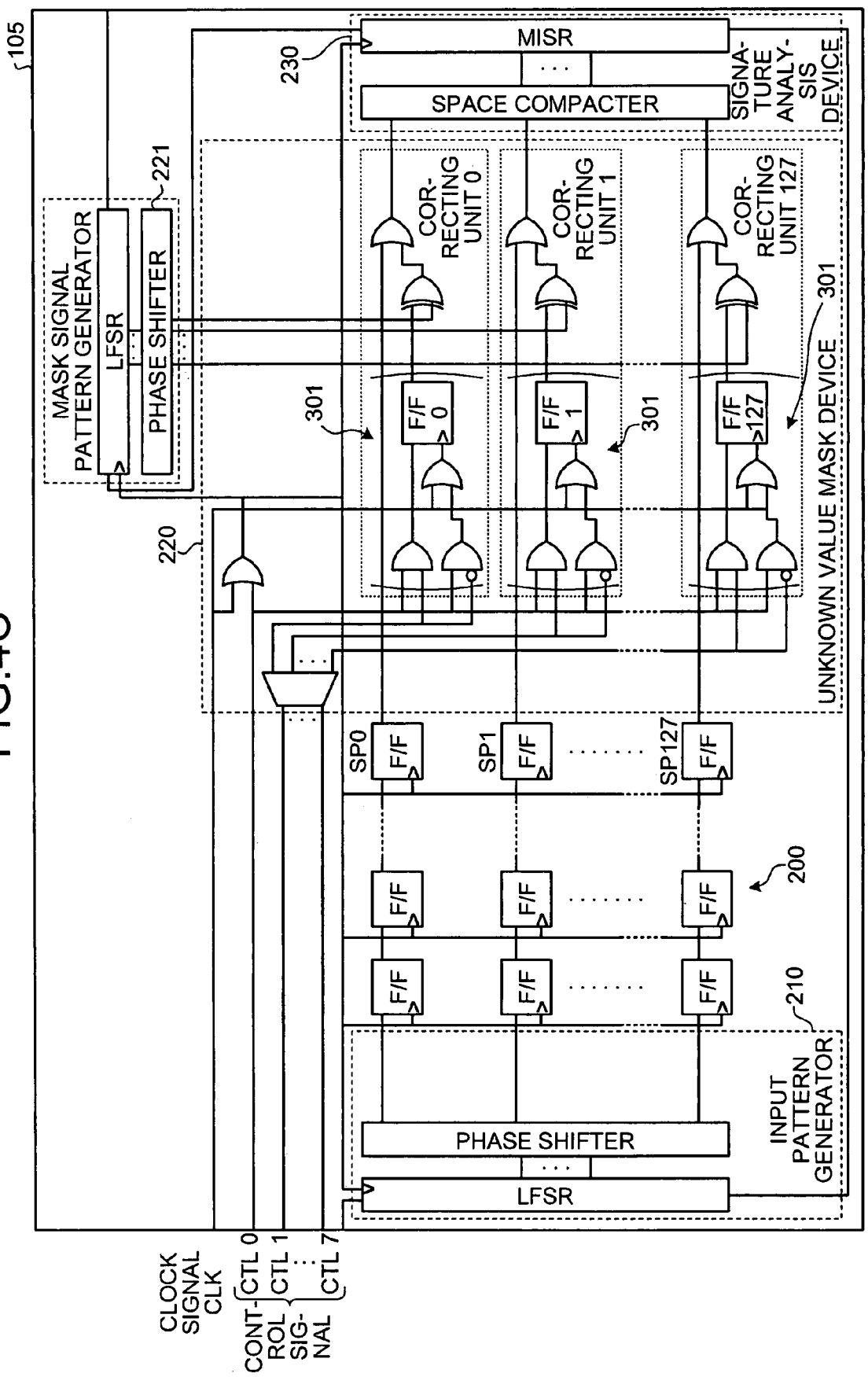
FIG. 4C is a circuit diagram of an embodiment of an LSI including the DFT circuit.
Figure 10:
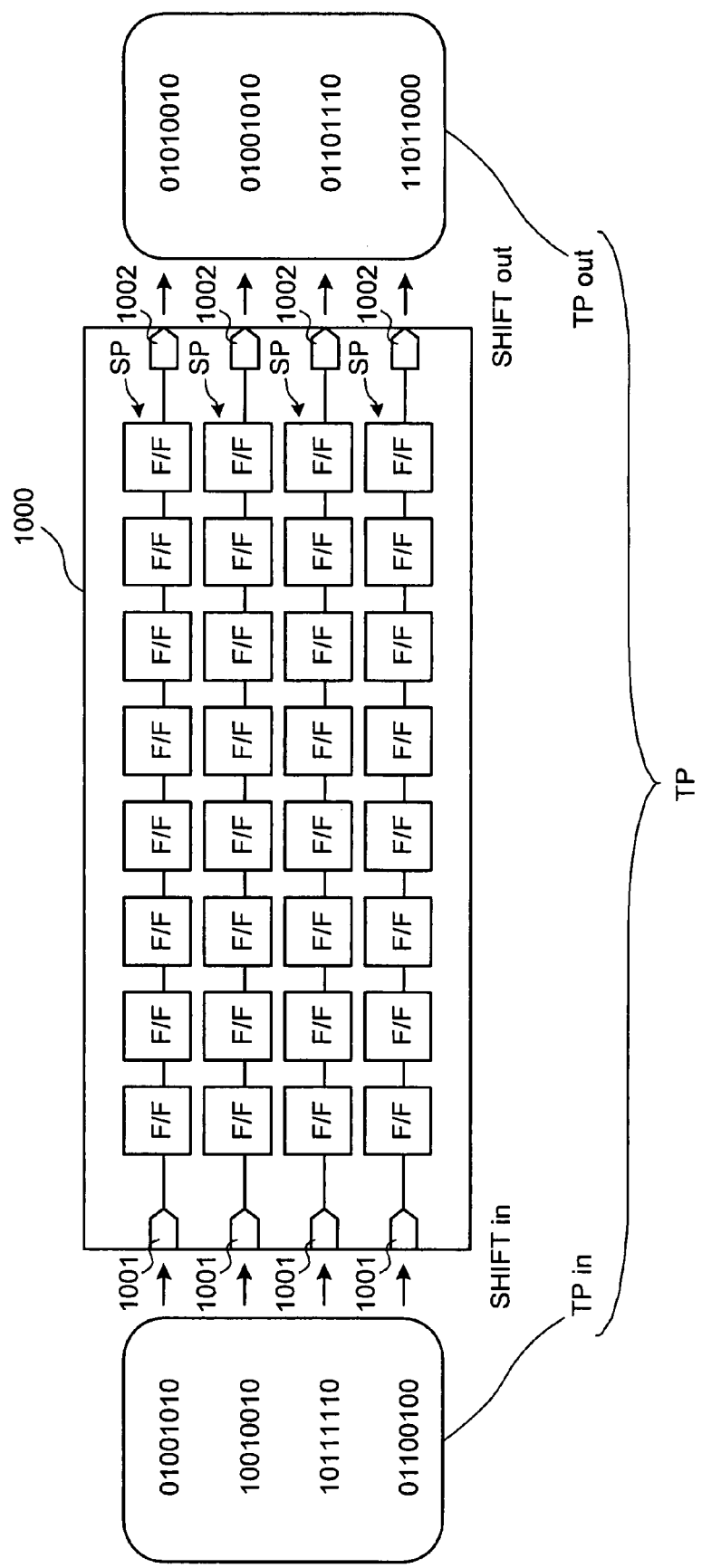
FIG. 10 is an explanatory diagram of a DSPT.
Figure 11:
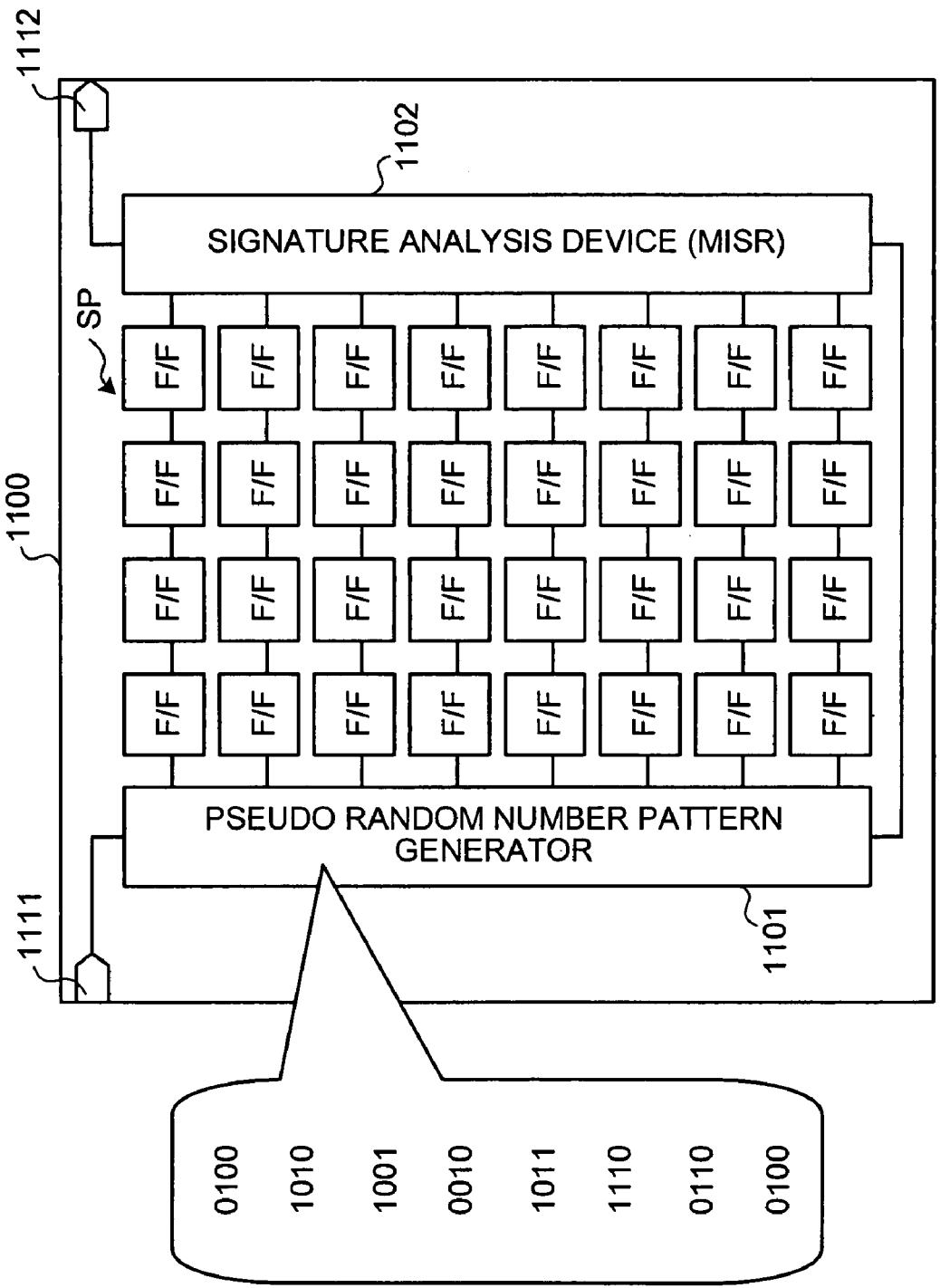
FIG. 11 is an explanatory diagram of a BIST.
Figure 12:
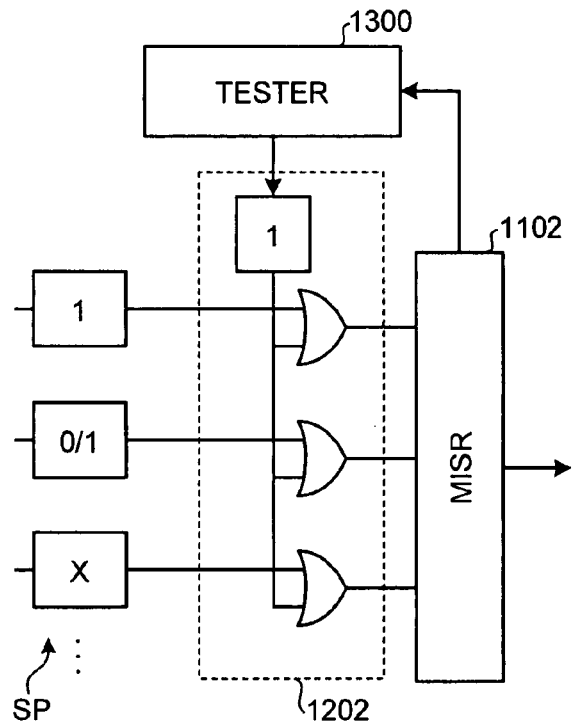
FIG. 12 is a circuit diagram of a bulk mask.
Figure 13:
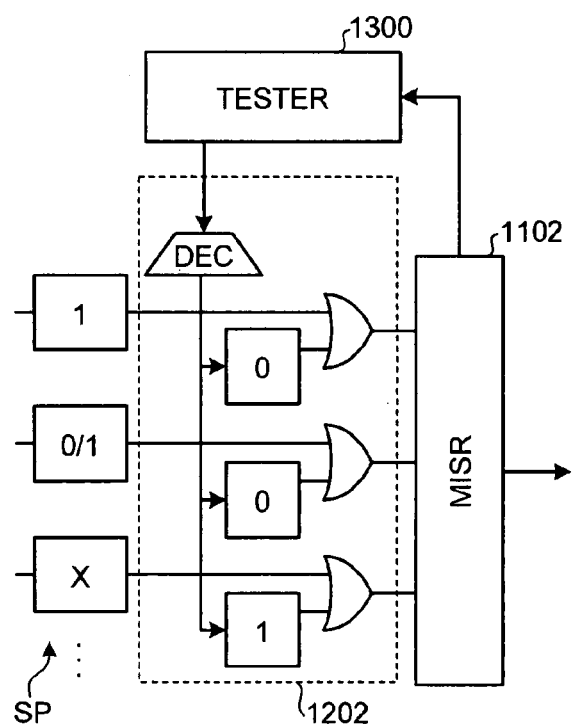
FIG. 13 is a circuit diagram of an individual mask.

FIG. 4C is a circuit diagram of an embodiment of an LSI including the DFT circuit. The LSI 105 in FIG. 4C is the embodiment where 128 scan paths (SP0 to SP127) 200 are the target circuits of LSI test.

Each of the input pattern generator (PRPG) 210 and the mask signal pattern generator (PRPG) 221 includes a linear feedback shift register (LFSR) and a phase shifter (phase adjuster). The signature analysis device (MISR) 230 includes a space compactor and MISR.

The unknown value mask device 220 includes an inverting circuit 301 including an F/F, an OR circuit, and two AND circuits. When the inverting order is input from the control signal CTL to the inverting circuit 301, the value of the mask signal M inverts. Accordingly, when the mask is made, the mask is released, and the value input from the scan path (SP) 200 is output as it is. On the contrary, if mask is not made, a new mask is made, and the fixed value "1" is output.

FIG. 5 is the code list of the control signal CTL. The control signal CTL is the control signal CTL to which the LSI 105 having 128 scan paths (SP) 200 as shown in FIG. 4C is applied. The control signal CTL includes CTL0 indicating pattern shift, and CTL1 to CTL7 for adjusting mask to scan path SP.

CTL0 is the control signal for pattern shift. When the value of CTL0 is "0", irrespective of the values of CTL1 to CTL7, the pattern shift of the scan path (SP) 200, and the shift of the pattern generator (PRPG) 210, the mask signal pattern generator 221, and the signature analysis device 230 are carried out (511). Furthermore, by this pattern shift, the value of all F/F in the unknown value mask device 220 is cleared to 0. Accordingly, the control signal CTL of CTL0=0 is output at timing of pattern shift.

On the other hand, CTL1 to CTL7 are the control signals CTL for correcting the mask signal, and indicate addresses of the correcting unit N that adjusts mask, among correcting unit 0 to 127 of the unknown value mask device 220. More specifically, "0000000" indicates setting the F/F in the unknown value mask device 220 corresponding to the scan path 0 to 1 (512). By this set, the mask process of the correcting unit 0 inverts. In other words, if the corresponding scan path 200 is masked, it is unmasked. And if the corresponding scan path 200 is not masked, it is masked.

In the same manner, when to adjust the mask of the unknown value mask device 220 corresponding to the scan path 1, "0000001" is output as the control signal CTL (513), and when to adjust the mask of the unknown value mask device 220 corresponding to the scan path 127, "1111111" is output as the control signal CTL (514). Note that the value of CTL0 is set to "1" when to make valid the control signal CTL for correcting mask signal.

FIG. 6 is a diagram of the initial state of the DFT circuit when a certain test pattern is input to the target circuit. In the example in FIG. 6, the test pattern generated by the PRPG 210 is input to the scan path 200, and each signal of "0, X, X, 1/0, 0/1, . . . " is output as the scan path output signal SOut output via the scan path 200. Furthermore, "1, 0, 1, 0, 1, . . . " is output as the mask signal M from the mask signal pattern generator 221. Furthermore, the F/F (correcting unit) in the unknown value mask device 220 is in initial state and indicates "0, 0, 0, 0, 0, . . . ". In the above initial state, the pattern output signal Pout to be output to the signature analysis device 230 indicates "1, X, 1, 1/0, 1, . . . ".

Since the scan paths SP0, SP2, and SP4 are set as mask targets of the mask signal M, the pattern output signal Pout corresponding to the scan paths SP0, SP2, and SP4 is masked and the fixed value "1" is output. Since the scan path SP2 among the scan path output signal SOut outputs the unknown value "X", it is desired not to output "X" to the MISR 230 as the pattern output signal Pout. Since the scan path SP3 outputs the expected value "0/1", it is desired to output "0/1" to the MISR 230 as the pattern output signal Pout to be subjected to the LSI test.

FIG. 7 is a data string of an example of the control signal CTL stored as test data. In the above case, the tester 130 reads out the control signals (701, 702) as shown in FIG. 7 and controls the unknown value mask device 220 according to the test pattern input to the scan path 200.

FIG. 8 is a diagram of the first step process by the control signal CTL. At the first step, the mask of the scan path SP1 is adjusted using the control signal (701) shown in FIG. 7. Since the mask signal M is set to "0" in the scan path SP1 as shown in FIG. 6, the unknown value output from the scan path SP1 is output as the pattern output signal POut as it is.

When the control signal CTL "10000001" (701) shown in FIG. 7 is input, the setting of the F/F1 of the unknown value mask device 220 is set to 1, and the output of the correcting unit 1 inverts, and mask is applied. Accordingly, the fixed value "1" is output as the pattern output signal POut as shown in FIG. 8 (810).

FIG. 9 is a diagram of the second step process by the control signal CTL. At the second step, the mask of the scan path SP4 is adjusted using the control signal (702) shown in FIG. 7. The fault value "0/1" is output as the scan path output signal SOut output from the scan path SP4 in FIG. 6. However, since "1" is set to the mask signal M for the path of the scan path SP4, in the initial state as shown in FIG. 6, the fault value "0/1" is masked, and "1" is output from the pattern output signal POut.

Therefore, the process to output the fault value "0/1" as the pattern output signal POut is carried out. More specifically, when the control signal CTL "10000100" shown in FIG. 7 is input (702), the setting of the F/F4 of the unknown value mask device 230 is set to 1, and the output of the correcting unit 4 inverts, and mask is released. Accordingly, the fault value ("0/1") is output as the pattern output signal Pout as shown in FIG. 9 (820).

The process explained above is carried out for all the scan paths SP (scan path SP 127 in the example of LSI 105 shown in FIG. 4A). Therefore, the pattern output signal POut as output result does not include unknown value. Furthermore, since all of the fault values are output, it is possible to perform the high quality LSI test.

As explained above, according to the semiconductor integrated circuit, recording medium, test data generating device, and LSI test device of the present invention, by controlling the unknown value mask device based on the mask pattern and the control signal, it is possible to guarantee the test quality, and to reduce the test data amount in comparison with the case when conventional individual mask circuit is used.

What is claimed is:

1. A semiconductor integrated circuit comprising:
a plurality of shift registers that receives a plurality of test patterns randomly generated; and
a mask device that masks, among the shift registers, a target shift register specified by a mask pattern randomly generated, wherein
when a shift register other than the target shift register outputs an unknown value, the mask device masks the shift register according to a mask signal, and
the mask device releases a mask of the target shift register according to a mask control signal, when the target shift register outputs a fault value.

2. A test-data generating device that generates test data using design data of a semiconductor integrated circuit that includes a plurality of shift registers that receives a plurality of test patterns randomly generated by a random test pattern generator, a mask device that masks, among the shift registers, a target shift register specified by a mask pattern randomly generated by a mask signal pattern generator, and a verification device that verifies a pattern output from the mask device, the test-data generating device comprising:
a generating unit that generates, when a shift register other than the target shift register outputs an unknown value, a mask signal to mask the shift register; and
a storing unit that stores a combination of the mask signal that masks the shift register and an expected output value output from the verification device as test data,
wherein the generating unit generates, when the target shift register outputs a fault value, a mask control signal to release a mask of the target shift register.

3. A test device that performs a fault test using a test-data generating device on a semiconductor integrated circuit that includes a plurality of shift registers that receives a plurality of test patterns randomly generated by a random test pattern generator, a mask device that masks, among the shift registers, a target shift register specified by a mask pattern randomly generated by a mask signal pattern generator, and a verification device that verifies a pattern output from the mask device, the test-data generating device including a generating unit that generates a signal to control the mask device, and a storing unit that stores a combination of the signal and an expected output value that is output from the verification device as test data, the test device comprising:
a control unit that reads, when a shift register other than the target shift register outputs an unknown value, a mask signal to mask an output of the shift register from the test data, to output to the mask device; and
a detecting unit that detects a fault of the semiconductor integrated circuit by comparing an output value from the verification device and the expected output value included in the test data,
wherein the control unit reads from the test data, when the target shift register outputs a fault value, a mask control signal to release a mask of the target shift register, and outputs the mask control signal to the mask device.

4. A test device comprising:
a pattern generator that generates and outputs a plurality of random test patterns to a plurality of shift registers;
a mask signal pattern generator that generates and outputs a random mask pattern to a target shift register among the plurality of shift registers;
a mask device that receives a plurality of signals output from the shift registers including a signal of the target shift register, masks a signal, indicating an unknown state, of a shift register other than the target shift register, unmasks a signal, indicating a fault, of the target shift register, and outputs the signals; and a verification device that compresses the signals output from the mask device.

5. A method of generating test data using design data on a semiconductor integrated circuit that includes a plurality of shift registers that receives a plurality of test patterns randomly generated by a random test pattern generator, a mask device that masks, among the shift registers, a target shift register specified by a mask pattern randomly generated by a mask signal pattern generator, and a verification device that verifies a pattern output from the mask device, the method comprising:

generating, when a shift register other than the target shift register outputs an unknown value, a mask signal to mask the shift register;

storing a combination of the mask signal that masks the shift register and an expected output value output from the verification device as test data; and generating when the target shift register outputs a fault value, a mask control signal to release a mask of the target shift register.

6. A method of performing a fault test using a test data generating device on a semiconductor integrated circuit that includes a plurality of shift registers that receives a plurality of test patterns randomly generated by a random test pattern generator, a mask device that masks, among the shift registers, a target shift register specified by a mask pattern randomly generated by a mask signal pattern generator, and a verification device that verifies a pattern output from the mask device, the test data generating device including a generating unit that generates a signal to control the mask device, and a storing unit that stores a combination of the signal and an expected output value that is output from the verification device as test data, the method comprising:

reading, when a shift register other than the target shift register outputs an unknown value, a mask signal to mask the shift register from the test data;

detecting a fault of the semiconductor integrated circuit by comparing a value output from the verification device and the expected output value included in the test data;

reading from the test data, when the target shift register outputs a fault value, a mask control signal to release a mask of the target shift register; and outputting the mask control signal to the mask device.

7. A non-transitory computer-readable recording medium that stores therein a program for generating test data using design data on a semiconductor integrated circuit that includes a plurality of shift registers that receives a plurality of test patterns randomly generated by a random test pattern generator, a mask device that masks, among the shift registers, a target shift register specified by a mask pattern randomly generated by a mask signal pattern generator, and a verification device that verifies a pattern output from the mask device, by causing a computer to execute:

generating, when a shift register other than the target shift register outputs an unknown value, a mask signal to mask the shift register; and storing a combination of the mask signal that masks the shift register and an expected output value output from the verification device as test data, generating, when the target shift register outputs a fault value, a mask control signal to release a mask of the target shift register.

8. A non-transitory computer-readable recording medium that stores therein a program for performing a fault test using a test-data generating device on a semiconductor integrated circuit that includes a plurality of shift registers that receives a plurality of test patterns randomly generated by a random test pattern generator a mask device that masks, among the shift registers, a target shift register specified by a mask pattern randomly generated by a mask signal pattern generator and a verification device that verifies a pattern output from the mask device, the test-data generating device including a generating unit that generates a signal to control the mask device, and a storing unit that stores a combination of the signal and an expected output value that is output from the verification device as test data, by causing a computer to execute:

reading, when a shift register other than the target shift register outputs an unknown value, a mask signal to mask the shift register from the test data;

detecting a fault of the semiconductor integrated circuit by comparing a value output from the verification device and the expected output value included in the test data;

reading from the test data, when the target shift register outputs a fault value, a mask control signal to release a mask of the target shift register; and outputting the mask control signal to the mask device.

* * * * *